United States Patent
Kinoshita

[19]

[11] Patent Number: 6,109,175
[45] Date of Patent: Aug. 29, 2000

[54] INTAGLIO PRINTING METHOD, INTAGLIO PRINTER, METHOD OF FORMATION OF BUMPS OR WIRING PATTERN, APPARATUS THEREFOR, BUMP ELECTRODE AND PRINTED CIRCUIT BOARD

[75] Inventor: Makoto Kinoshita, Tottori-ken, Japan

[73] Assignee: Ricoh Microelectronics Co., Ltd., Tottori, Japan

[21] Appl. No.: 09/026,680

[22] Filed: Feb. 20, 1998

[30] Foreign Application Priority Data

Feb. 21, 1997 [JP] Japan .................................... 9-053948

[51] Int. Cl.[7] .............................. B41M 1/10; H05K 3/00; H05K 3/02; H05K 3/10
[52] U.S. Cl. .......................... 101/170; 101/483; 428/901; 427/96; 29/829; 29/846
[58] Field of Search ...................... 101/170, 150, 101/153, 158, 163, 164, 157, 169, 395, 401.1, 491, 483; 428/901, 601; 427/96; 29/846, 850, 829

[56] References Cited

U.S. PATENT DOCUMENTS

| | | | |
|---|---|---|---|
| 4,566,384 | 1/1986 | Matsumoto | 101/170 |
| 4,908,346 | 3/1990 | Strom et al. | 505/1 |
| 4,934,714 | 6/1990 | Lynch | 101/415.1 |
| 5,209,873 | 5/1993 | Yamamoto et al. | 252/512 |
| 5,227,223 | 7/1993 | Morgan et al. | 428/209 |
| 5,362,513 | 11/1994 | Shimada et al. | 427/58 |
| 5,366,760 | 11/1994 | Fujii et al. | 427/96 |
| 5,882,722 | 3/1999 | Kydd | 427/123 |

FOREIGN PATENT DOCUMENTS 2 177 262  1/1987  United Kingdom .

OTHER PUBLICATIONS

Patent Abstract of Japan, vol. 095, No. 010, Nov. 30, 1995, JP 07 169635, Jul. 4, 1995.

*Primary Examiner*—Kimberly Asher
*Attorney, Agent, or Firm*—Oblon, Spivak, McClelland, Maier & Neustadt, P.C.

[57] ABSTRACT

An intaglio printing method and an intaglio printer are proposed, which are suitable for forming a wiring pattern and/or bumps such as bump electrodes on a print receiving material on which printing is to be performed, such as a substrate and a semiconductor package, using a paste or a fused metal. In addition, a method of forming the wiring pattern and the bumps such as bump electrodes on the printing substrate, using the intaglio printing method, a method for forming a wiring pattern, an apparatus for carrying out the method of forming the wiring pattern, the bump electrode and the wiring pattern are proposed.

94 Claims, 6 Drawing Sheets

INTAGLIO PRINTING METHOD, INTAGLIO PRINTER, METHOD OF FORMATION OF BUMPS OR WIRING PATTERN, APPARATUS THEREFOR, BUMP ELECTRODE AND PRINTED CIRCUIT BOARD

BACKGROUND OF THE INVENTION

1. Field of the Invention

The present invention relates to an intaglio printing method and an intaglio printer suitable for forming a wiring pattern and/or bumps such as bump electrodes on a print receiving material on which printing is to be performed, such as a substrate and a semiconductor package, using a paste or a fused metal.

The present invention also relates to a method of forming the wiring pattern and the bumps such as bump electrodes on a printing substrate on which printing is to be performed, such as a substrate and a semiconductor package, using the intaglio printing method, a method for forming a wiring pattern, an apparatus for carrying out the method of forming the wiring pattern, the bump electrode and the wiring pattern.

2. Discussion of Background

As methods of forming a wiring pattern on a substrate, there are conventionally known a method of performing printing using a stamp and an electroconductive paste; a method of masking a substrate with a stencil and spraying an electroconductive material over the masked substrate; a method of depicting a conductive pattern, using a syringe; a method of depositing an electroconductive material on the concave and convex portions of a substrate and polishing the electroconductive deposited convex portions to form a wiring pattern in the concave portions, and using the concave portion as the wiring pattern; a method of forming a wiring pattern by die-casting an electroconductive material onto concave portions of a substrate; a method of printing a wiring pattern on the surface of a substrate, using a catalyst, and causing a metal to separate therefrom; a method of printing a wiring pattern on a substrate by performing vacuum deposition of a metal on the substrate through a stencil; and a method of forming a wiring pattern by bringing a metal foil into pressure contact with a substrate, using a die in the shape of the wiring pattern, which is heated to high temperature.

The element technologies for the above-mentioned conventional methods are composed of a patterning technology and a film formation technology. Currently, however, the patterning is performed by printing or photolithography, and the film formation is performed by laminating metal foils or plating. Representative examples thereof are subtractive method and additive method.

The subtractive method, which is also referred to as etched foil method, is carried out by performing patterning by etching. This method is currently used most. In this method, a copper foil laminated plate is first fabricated by laminating a copper foil having fine projections on a laminating surface thereof on a substrate such as a glass epoxy substrate with the application of high pressure thereto. The copper foil side of the copper foil laminated plate is subjected to photoresist coating. A photo film with a design of a wiring pattern is then superimposed on the photoresist coated side of the plate, exposed to light and then subjected to development, whereby a photoresist masking pattern is formed on the copper foil laminated plate. The copper foil laminated plate with the photoresist masking pattern is then etched, whereby a wiring pattern is formed on the copper foil laminated plate. This method has the shortcomings that the above-mentioned steps including the art work of the photo film are complicated, high density is difficult to attain in comparison with the additive method which will be described in detail later, and the method is more or less lacking in patterning reliability. Furthermore, a photoresist, a resist releasing agent, an etching agent and others are required as auxiliary materials for this method, so that this method has a further shortcoming that the production cost including the cost for treating waste fluids to be discarded is high.

The above-mentioned additive method is also called plating method. In this method, an adhesive agent is applied to the surface of a substrate such as a substrate made of glass epoxy, and then a catalyst is applied thereto to improve the adhesiveness of a plating. A photoresist is coated thereon and a photo film is superimposed on the coated photoresist, and exposure and development are then performed, whereby a masking pattern is formed. Non-electrolytic copper plating is performed in the areas free of the masking, whereby a wiring pattern is formed. This method is superior to the subtractive method for attaining high density and reliability, but has the shortcomings that the process is complicated and the production cost is high.

For the formation of bump electrodes on a semiconductor package, a larger number of methods have been proposed and used in practice in comparison with the wiring methods of printed wiring boards.

For instance, for the production of BGA, a method of placing in a pad solder balls which are equal in size to bump electrodes, and joining the solder balls to the pad of a package by reflow is currently most used. In this method, solder balls are joined to the circuit pads on the side of the package. In this method, on the side of a solder manufacturer, a fused solder is added dropwise to an oil which is heated above the melting point of the solder, whereby fused solder particles, each of which is substantially in the shape of a true sphere, are formed, and the thus formed fused solder particles are cooled, washed and classified in accordance with the particle sizes thereof. The solder balls for the formation of the bump electrode are thus produced. In a process of forming the bump electrode, using the solder balls, the solder balls are moved onto the pad on the side of the package, using absorption nozzles, reflowed and joined.

In this method, however, the solder balls are expensive, the height of bump electrodes varies in accordance with the variation of the diameter of each bump electrode, so that an open portion is formed in a joining portion when the bump electrodes are mounted on a substrate. Furthermore, the bump electrodes may fall off the pad on the package side due to imperfect fusing of the bump electrodes and the pad on the package side. Cracks are formed in a junction portion between the bump electrodes on the package side and the pad on the substrate side, or the bump electrodes are peeled off the pad, due to the stress caused by the difference in the coefficient of thermal expansion between the substrate and the package.

In addition, it is known that a method of forming solder balls by cutting a thread solder or a ribbon solder with a predetermined length and punching the cut solder into a cylindrical solder, and fusing the solder to form solder balls, or a method of using the punched cylindrical solder as it is and moving the solder onto a pad of a package and subjecting solder to reflow. These methods also have the same shortcomings as mentioned above for the same reasons as mentioned above, such as the formation of the open portion in the junction portion, falling off of the bumps, the formation of cracks in the junction portion between the bump on the package side and the pad on the substrate side, or the peeling of the bump on the package side off the pad on the substrate side.

Furthermore, there is known a method of forming bump electrodes on the pad on the package by printing a solder. As the printing masks used in this method, there are a stencil mask and an intaglio printing mask, and as the solders for use in this method, there are a solder paste and a fused solder. With the combination of such printing masks and the solders, various methods have been proposed. In the method of performing printing using a solder paste, it is necessary to perform reflow after the printing.

In these methods, the diameter of the bump changes in accordance with the variation of the filling amount of the solder into the mask which depends upon the degree of scooping the solder by a squeegee, and also in accordance with the variation of the degree of the passing of the solder through the mask, so that these methods have the shortcoming that open portions may be formed in the junction portion. Furthermore, when the fusing of the pad on the package side and the bump electrodes is imperfect, the bump electrodes will fall off the pad on the package side. Furthermore, cracks are formed in a junction portion between the bump electrodes on the package side and the pad on the substrate side, or the bump electrodes are peeled off the pad, due to the stress caused by the difference in the coefficient of thermal expansion between the substrate and the package. In the method of forming the bump electrodes by printing a cream solder, using the stencil mask, the loss of holes in the mask may occur due to the missing of cavity holes in a photosensitive resin formed by photolithography when plating is performed in the course of the production of a metal mask (that is, an additive mask) which is currently mainly used. This hinders the formation of fine bumps.

As methods of forming bump electrodes by plating, the following three methods are mainly known: A method comprising the steps of masking the circumference of a pad with a thin film of a liquid resist and then forming a bump electrode with electrolytic plating. In this method, the plating tends to spread transversely, so that this method is not suitable for forming bump electrodes with multiple pins. In order to improve the above method, there has been proposed a method comprising the steps of forming deep holes in a thick dry film by photolithography and performing electrolytic plating in the deep holes to secure the plating thickness for the bumps. This method has a shortcoming that the production cost is high. Under such circumstances, there is proposed a method of forming bump electrodes with multiple pins, while securing a sufficient height for the bumps by performing non-electrolytic plating, using a thin liquid resist, in an attempt to reduce the production cost. However, the objects of the method has not yet sufficiently been attained.

Furthermore, a method of forming bump electrodes, using a conventional wire bonding technology for internal bonding of semiconductor packages is also proposed. In this method, balls formed by discharging to a metal thin wire at a tip of a capillary are bonded to a pad as they are to form bump electrodes. This method features how to cut unnecessary wire portions. There are several methods of cutting unnecessary wire portions. Any of the cutting methods, however, has the problem that the height of the bumps cannot be made uniform. In order to solve this problem, a method of leveling the height of the bumps by use of a holding jig or by polishing, and a method of making the balls more spherical by being fused under reflow have been proposed. However, these methods have the shortcomings that bumps cannot be formed at a time and the production efficiency thereof is low and it is difficult to prepare bump electrodes with multiple pins.

As other methods of forming bump electrodes and junction methods for semiconductor packages, there have been proposed a method of forming bump electrodes using a solder or an electro-conductive adhesive agent supplied by a dispenser, a method of forming bump electrodes made of an electro-conductive photosensitive resin by photolithography, a junction method for semiconductor packages, using an anisotropic electroconductive resin, and a method of forming bump electrodes, using coagulation force of super solder. These methods, however, still have problems with respect to the production cost and the quality of the junction.

Thus, the conventional methods have not yet sufficiently attained requests such as (a) the formation of bumps with high density, (b) high production reliability free of the formation of open portions in the junction, the falling off of bumps, the formation of cracks in the junction portion between the bumps on the package side and the pad on the substrate side, or the peeling of the bumps on the package side off the pad on the substrate side, (c) the formation of bumps with high productivity, and (d) the reduction of the cost for the formation of the bump electrodes.

SUMMARY OF THE INVENTION

It is therefore a first object of the present invention to provide a printing method capable of forming a wiring pattern or bumps such as bump electrodes on a printing substrate on which printing is to be performed, such as a substrate and a semiconductor package, using a paste or a fused metal, free of the above-mentioned conventional problems, with low cost and high productivity.

A second object of the present invention is to provide a printer capable of performing the above-mentioned printing method.

A third object of the present invention is to provide a method capable of forming bumps such as bump electrodes, a wiring pattern, the bumps and the wiring pattern, or the bumps and/or the wiring pattern on a printing substrate on which printing is to be performed, such as a substrate and a semiconductor package, with excellent reliability, when actually mounting the bumps on the printing substrate, free of the formation of open portions in a junction portion between the bumps on a package side and a pad on the substrate side, the falling off of bumps, the formation of cracks in the junction portion, or the peeling of the bumps on the package side off the pad on the substrate side, with low cost and high productivity.

A fourth object of the present invention is to provide a method of forming a wiring pattern on a front or back side of a printed circuit board and/or on a resist-coated substrate and forming a junction portion and/or a crossover portion of the wiring pattern.

A fifth object of the present invention is to provide an apparatus for forming the bumps and/or the wiring pattern on a substrate.

A sixth object of the present invention is to provide a bump electrode with excellent reliability, when actually mounting the electrode on the printing substrate, free of the formation of open portions in a junction portion between the bump electrode on a package side and a pad on the substrate side, the falling off of the bump electrode, the formation of cracks in the junction portion, or the peeling of the bump electrode on the package side off the pad on the substrate side.

A seventh object of the present invention is to provide a printed circuit board.

The above objects of the present invention can be achieved by an intaglio printing method, an intaglio printer, methods of forming bumps, a wiring pattern, the bumps and the wiring pattern, or the bumps and/or the wiring pattern on a printing substrate, a method of forming a wiring pattern on a front or back side of a printed circuit board and/or on a resist-coated substrate and forming a junction portion and/or a crossover portion of the wiring pattern, an apparatus forming bumps and/or the wiring pattern on a substrate, a bump electrode, and a printed circuit board as described in detail in the present specification.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1:
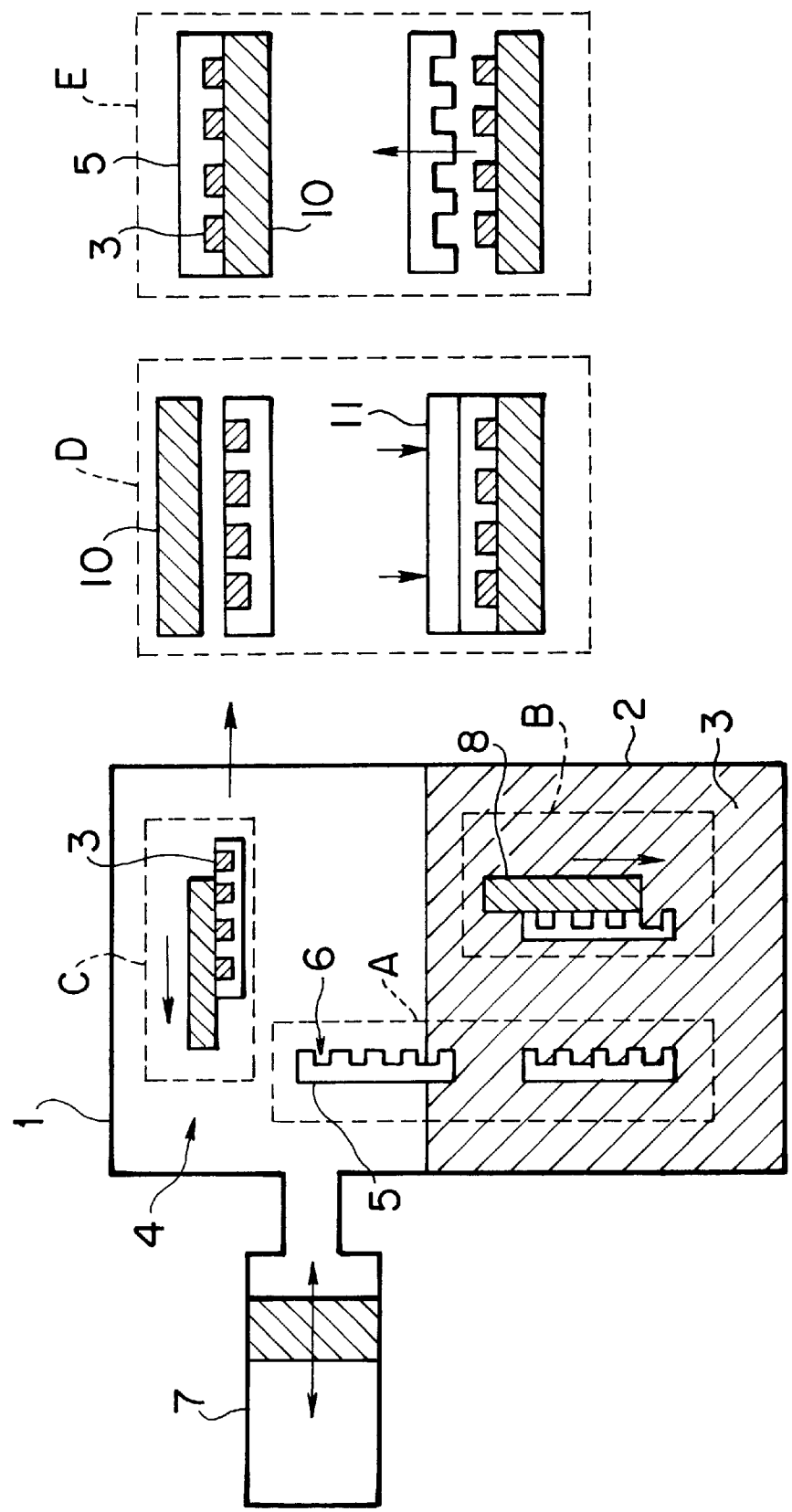
FIG. 1 is a schematic cross-sectional view of an apparatus in explanation of the intaglio printing method of the present invention.

The intaglio printing method of the present invention comprises the steps of (a) bringing an intaglio printing master having portions depressed in a printing shape below the surface of the printing master, in which depressed portions a paste or a fused material is filled, into close contact with a print receiving material which can receive the paste or the fused metal, and (b) separating the intaglio printing master from the print receiving material to transfer the paste or the fused material to the print receiving material, wherein the intaglio printing method further comprises the steps of:

(1) immersing the intaglio printing master having the depressed portions in the paste or the fused metal to fill the depressed portions with the paste or the fused metal, (2) bringing a shielding plate into close and sliding contact with the surface of the printing master to remove therefrom the paste or the fused metal and to close, with the shielding plate, the openings of the depressed portions in which the paste or the fused material is filled, (3) taking out the printing master to which the shielding plate is closely attached from the paste or the fused metal, (4) separating the shielding plate from the surface of the printing master, (5) bringing the printing master free of the shielding plate into close contact with the print receiving material, and (6) separating the printing master from the print receiving material to transfer the paste or the fused material in the printing shape to the print receiving material.

According to this intaglio printing method, a wiring pattern or bumps can be easily obtained by repeatedly filling the depressed portions in a printing shape with the paste or the fused metal. Furthermore, the materials employed in this intaglio printing method are inexpensive and the number of the kinds of the materials is small, so that wiring patterns and bumps such as bump electrodes can be formed on a substrate or on a semiconductor package at low cost with exceedingly high productivity.

In the above-mentioned intaglio printing method of the present invention, the intaglio printing master having the depressed portions is immersed in the paste or the fused metal to fill the depressed portions with the paste or the fused metal, and the shielding plate is brought into close and sliding contact with the surface of the printing master to remove therefrom the paste or the fused metal and to close the openings of the depressed portions in which the paste or the fused material is filled, with the shielding plate, whereby a constant amount of the paste or the fused metal is placed in the depressed portions. In other words, during the course of the shielding plate being brought into close and sliding contact with the surface of the printing master, thereby removing the paste or the fused metal from the surface of the printing master, and tightly closing the openings of the depressed portions with the shielding plate, the upper level of the paste or the fused material filled in the depressed portions becomes equal to the level of the surface of the printing master, so that a proper amount of the paste or the fused metal is constantly filled in the depressed portions.

As a result, the paste or the fused metal can be transferred to the print receiving material in an amount corresponding to the amount thereof filled in the depressed portions.

Furthermore, the shielding plate has a flat and smooth surface and comes into close contact with the surface of the printing master, so that the leakage of the paste or the fused metal from the openings of the depressed portions can be securely prevented. Accordingly, the transfer of the paste or the fused metal to unnecessary portions on the print receiving material and the deformation of the printing shape of the transferred paste or fused metal can also be securely prevented.

In the intaglio printing method of the present invention, it is preferable that the intaglio printing master be placed in vacuum or in an atmosphere of reduced pressure prior to the step (1) of immersing the intaglio printing master having the depressed portions in the paste or the fused metal. This is because by placing the printing master in vacuum or in an atmosphere of reduced pressure prior to the above step (1), gases remaining in the depressed portions, if any, can be removed, and the paste or the fused metal can be completely filled in the depressed portions up to every corner and end portion of the depressed portions. Furthermore, gases present in the paste or the fused metal can be removed therefrom when the paste or the fused metal is placed in vacuum or under reduced pressure, so that the filling of the paste or the fused metal in the depressions can be performed sufficiently.

Furthermore, in the intaglio printing method of the present invention, it is preferable that in the step (1) of immersing the intaglio printing master having the depressed portions in the paste or the fused metal, pressure be applied to the paste or the fused metal in order to completely fill the depressed portions with the paste or the fused metal up to every corner and end portion of the depressed portions.

When the intaglio printing method of the present invention is carried out, using a paste which contains a metal, or a fused metal, it is also preferable that the intaglio printing method be carried out in an atmosphere of an inert gas under reduced pressure in order to prevent the oxidation of the metal.

Furthermore, it is preferable that the printing master be brought into close contact with the print receiving material, and then be separated from the print receiving material to transfer the paste or the fused metal filled in the depressed portions of the printing master to the print receiving material, while the paste in the depressed portions is in an unsolidified state, or while the fused metal in the depressed portions is still in a fused state, since by this process, the fused metal or the paste transferred to the print receiving material can be caused to firmly adhere to the print receiving material.

To be more specific, it is preferable that in the intaglio printing method of the present invention, the step (5) of bringing the printing master free of the shielding plate into close contact with the print receiving material, and the step (6) of separating the printing master from the print receiving material to transfer the paste or the fused metal in the printing shape to the print receiving material be carried out while the paste in the depressed portions is in an unsolidified state, or while the fused metal in the depressed portions is still in a fused state.

It is also preferable that the printing master be brought into close contact with the print receiving material, while the paste in the depressed portions is in an unsolidified state, or while the fused metal in the depressed portions is still in a fused state, and the paste or the fused metal filled in the depressed portions be solidified, for instance, by cooling, and then the printing master be separated from the print receiving material to transfer the paste or the metal solidified in the depressed portions of the printing master to the print receiving material, since by this process, the metal or the paste can be accurately transferred in the desired printing shape to the print receiving material, and the metal or the paste transferred to the print receiving material can be caused to firmly adhere to the print receiving material.

To be more specific, it is preferable that in the intaglio printing method of the present invention, the step (5) of bringing the printing master free of the shielding plate into close contact with the print receiving material be carried out while the paste in the depressed portions is in an unsolidified state, or while the fused metal in the depressed portions is still in a fused state, and the step (6) of separating the printing master from the print receiving material to transfer the paste or the fused metal in the printing shape to the print receiving material be carried out after the paste or the fused metal in the depressed portions is in a solidified state.

When the surface tension of the fused metal is large, if the shielding plate is removed from the openings of the depressed portions in the printing shape in which the fused metal is filled, the fused metal tends to separate in the form of spherical drops from the shielding plate due to the surface tension of the fused metal, so that there is the risk that the fused metal filled in shape of a thin line in the depressed portions is cut, in particular, when the depressed portions are in the shape of fine lines as the printing shape, and the printing in the shape of fine lines will become impossible.

In such a case, it is preferable that the printing master to which the shielding plate is closely attached be taken out from the fused metal, and the fused metal in the depressed portions be cooled below the melting point of the fused metal, and then the shielding plate be separated from the surface of the printing mater, and the printing master free of the shielding plate be brought into close contact with the print receiving material, and then the cooled metal be heated to the melting point of the metal or above, and then cooled below the melting point of that metal, at that moment, the printing master be separated from the print receiving material to transfer the fused metal in the printing shape to the print receiving material.

To be more specific, it is preferable that in the intaglio printing method of the present invention, immediately after the step (3) of taking out the printing master to which the shielding plate is closely attached from the fused metal, the fused metal in the depressed portions be cooled below the melting point of the fused metal, and the step (4) of separating the shielding plate from the surface of the printing mater be carried out, and in the step (5) of bringing the printing master free of the shielding plate into close contact with the print receiving material, the cooled metal in the depressed portions of the printing master be heated to the melting point of the metal or above, and then cooled below the melting point of the metal, at that moment, the printing master be separated from the print receiving material to transfer the fused metal in the printing shape to the print receiving material.

It is also preferable that in the intaglio printing method of the present invention, the step (5) of bringing the printing master into close contact with the print receiving material be carried out with the printing master being in pressure contact with the print receiving material in any of the above-mentioned processes of the intaglio printing method of the present invention, in particular, while the fused metal in the depressed portions is still in a fused state or while the paste in the depressed portions is in an unsolidified state in order to fix the paste or the fused metal more firmly to the print receiving material.

It is preferable that the intaglio printing master having portions depressed in the printing shape below the surface of the printing master for use in the present invention be made of a plastic material, more preferably an elastic plastic material.

An intaglio printing master made of a plastic plate is less expensive than an intaglio printing master made of a metal. In particular, when an elastic plastic material is used for the intaglio printing master, when the intaglio printing master with the depressed portions filled with the paste or the fused metal in the printing shape is brought into close and pressure contact with the print receiving material, the intaglio printing master can be brought into close contact with the surface of the printing master, so that the leakage of the paste or the fused metal from the openings of the depressed portions can be securely prevented. Accordingly, the transfer of the paste or the fused metal to unnecessary portions on the print receiving material and the deformation of the printing shape of the transferred paste or fused metal can also be securely prevented.

It is preferable to form the depressed portions in the printing shape below the surface of the printing master by excimer laser working because fine depressed portions in the printing shape with smooth inner walls, which are suitable for the formation of wiring patterns and/or bumps, can be formed by excimer laser working.

Representative examples of the paste for use in the intaglio printing method of the present invention are electroconductive adhesive agent, anisotropic electroconductive adhesive agent, electroconductive polymer, cream solder, tin paste, silver paste, silver palladium paste, and carbon paste. Representative examples of the fused metal for use in the intaglio printing method of the present invention are eutectic solder, high-temperature solder, low-temperature solider, tin, silver, and palladium.

The intaglio printing method of the present invention can be easily carried out, for example, by an intaglio printer which is capable of (a) bringing an intaglio printing master having portions depressed in a printing shape below the surface of the printing master, in which depressed portions a paste or a fused metal is filled, into close contact with a print receiving material which can receive the paste or the fused metal, and (b) separating the intaglio printing master from the print receiving material to transfer the paste or the fused metal to the print receiving material, which intaglio printer comprises an airtight housing for holding therein the paste or the fused metal, provided with a vacant space therein, means for decreasing or increasing the pressure in the vacant space of the airtight housing, a shielding plate which can be brought into close and sliding contact with the surface of the printing master which is immersed in the paste or the fused metal to remove the paste or the fused metal therefrom and to close the openings of the depressed portions in which the paste or the fused metal is filled, means for immersing the intaglio printing master having portions depressed in the printing shape below the surface of the printing master in the paste or the fused metal which is placed in the airtight housing, to fill the depressed portions with the paste or the fused metal, means for bringing the shielding plate into close and sliding contact with the surface of the printing master, thereby removing the paste or the fused metal therefrom and closing the openings of the depressed portions in which the paste or the fused metal is filled, with the shielding plate, means for taking out the printing master to which the shielding plate is closely attached from the paste or the fused metal, means for separating the shielding plate from the surface of the printing master, means for bringing the printing master free of the shielding plate into close contact with the print receiving material, and means for separating the printing master from the print receiving material to transfer the paste or the fused metal in the printing shape to the print receiving material.

As the shielding plate for use the above-mentioned intaglio printer, it is preferable that the surface of the shielding plate which comes into contact with the surface of the printing master be flat and smooth, and that the shielding plate be made of a plastic plate or sheet, such as a teflon plate or sheet, having a smooth surface, water repellency, wear-resistant properties, heat-resistant properties, and solvent-resistant properties.

A method of forming bumps and/or a wiring pattern on a substrate of the present invention will now be explained.

In this method of forming bumps and/or a wiring pattern on a substrate, there is employed an intaglio printing master having bump female die portions and/or groove portions corresponding to the wiring pattern, each in a printing shape, depressed below the surface of the printing master, and the intaglio printing method of the present invention is carried out, which comprises the steps of (a) bringing the intaglio printing master, with a paste or a fused metal being filled in the bump female die portions and/or the groove portions, into close contact with a print receiving material, and (b) separating the intaglio printing master from the print receiving material to transfer the paste or the fused metal to the print receiving material, wherein the intaglio printing method further comprises the steps of:

(1) immersing the intaglio printing master having the bump female die portions and/or the groove portions, each in the printing shapes, in the paste or the fused metal to fill the bump female die portions and/or the groove portions with the paste or the fused metal, (2) bringing a shielding plate into close and sliding contact with the surface of the printing master to remove the paste or the fused metal therefrom and to close the openings of the bump female die portions and/or the openings of the groove portions in which the paste or the fused metal is filled, with the shielding plate, (3) taking out the printing master to which the shielding plate is closely attached from the paste or the fused metal, (4) separating the shielding plate from the surface of the printing master, (5) bringing the printing master free of the shielding plate into close contact with the print receiving material, and (6) separating the printing master from the print receiving material to transfer the paste or the fused metal in the printing shapes to the print receiving material, whereby bumps and/or the wiring pattern is formed on the receiving material serving as the substrate.

In the above-mentioned method of forming bumps and/or a wiring pattern on a substrate, for the same reasons as in the above-mentioned intaglio printing method of the present invention, (a) it is preferable that the intaglio printing master be placed in vacuum or in an atmosphere of reduced pressure prior to the step (1) of immersing the intaglio printing master having the bump female die portions and/or the groove portions, each in the printing shapes, in the paste or the fused metal to fill the bump female die portions and/or the groove portions with the paste or the fused metal, (b) it is preferable that in the step (1) of immersing the intaglio printing master having the bump female die portions and/or the groove portions, each in the printing shapes, in the paste or the fused metal, pressure be applied to the paste or the fused metal in order to completely fill the bump female die portions and/or the groove portions with the paste or the fused metal up to every corner and end portion of the depressed portions, (c) it is preferable that the atmosphere in the reduced pressure be an atmosphere of an inert gas under reduced pressure, (d) it is preferable that the printing master be brought into close contact with the print receiving material, and then be separated from the print receiving material to transfer the paste or the fused metal filled in the bump female die portions and/or the groove portions of the printing master to the print receiving material, while the paste in the depressed portions is in an unsolidified state, or while the fused metal in the depressed portions is still in a fused state, (e) it is preferable that the printing master be brought into close contact with the print receiving material, while the paste in the bump female die portions and/or the groove portions is in an unsolidified state, or while the fused metal in the bump female die portions and/or the groove portions is still in a fused state, and the paste or the fused metal filled in the bump female die portions and/or the groove portions be solidified, for instance, by cooling, and then the printing master be separated from the print receiving material to transfer the paste or the metal solidified in the bump female die portions and/or the groove portions of the printing master to the print receiving material, (f) when a printing master with fine groove portions corresponding to the wiring pattern is used, it is preferable that the printing master to which the shielding plate is closely attached be taken out from the fused metal, and the fused metal in the groove portions be cooled below the melting point of the fused metal, and then the shielding plate be separated from the surface of the printing mater, and the printing master free of the shielding plate be brought into close contact with the print receiving material, and then the cooled metal be heated to the melting point of the metal or above, and then cooled below the melting point of that metal, at that moment, the printing master be separated from the print receiving material to transfer the fused metal in the printing shape to the print receiving material, (g) it is preferable that the printing master be brought into close contact with the print receiving material with the printing master being in pressure contact with the print receiving material while the fused metal in the bump female die portions and/or the groove portions of the printing master is still in a fused state or while the paste in the bump female die portions and/or the groove portions of the printing master is in an unsolidified state, and the fused metal or the paste be transferred to the print receiving material, (h) it is preferable that the intaglio printing master having the bump female die portions and/or the groove portions be made of a plastic material, more preferably an elastic plastic material, and (i) it is also preferable that the bump female die portions and/or groove portions corresponding to the wiring pattern of the printing master be formed by excimer laser working.

According to the above-mentioned method of forming bumps, there can be formed, on boards or substrates such as semiconductor packages, bumps such as bump electrodes with excellent reliability, free of the formation of open portions in a junction portion between the bumps on a package side and a pad on the substrate side, when actually mounting the bumps on the printing substrate, and also free of the falling off of bumps, the formation of cracks in the junction portion, or the peeling of the bumps on the package side off the pad on the substrate side, with low cost and high productivity.

Furthermore, the bump female die portions in the shape of a circular cylinder, a cone or pyramid, or a frustum of a cone or pyramid can be easily formed in a plastic plate by excimer laser working, whereby the above-mentioned excellent bumps can be formed.

Furthermore, according to the above-mentioned method of forming the wiring pattern, the depth and the width of the groove portions corresponding to the wiring pattern can be adjusted as desired, so that there can be easily formed a wiring pattern with a cross-section at right angles with respect to the extending direction of the corresponding groove portions having such an aspect ratio of the depth thereof to the width thereof that the depth thereof is greater than and the width thereof is smaller than the respective depth and width of an aspect ratio of 1:5, although it is difficult to form such a wiring pattern by conventional methods. Therefore, it is possible to reduce the width of the wiring pattern without reducing the cross-section of the wiring pattern, so that a wiring pattern with high density can be formed while maintaining the low resistance thereof.

By use of an intaglio printing master in which there are formed the bump female die portions as well as the groove portions corresponding to the wiring pattern, bumps and the wiring pattern can be formed on the substrate at the same time.

Furthermore, by use of the intaglio printing master having bump female die portions and/or groove portions corresponding to the wiring pattern, each in a printing shape, depressed below the surface of the printing master in the above-mentioned intaglio printing method, there can be formed bumps and/or a wiring pattern in a super-imposed manner on a printed circuit board which is fabricated by a conventional method. To be more specific, the wiring pattern fabricated by the method of the present invention can be formed on a wiring pattern of a printed circuit board fabricated by a conventional method and/on a resist coating provided on the conventional printed circuit board, thereby forming a junction portion of the wiring pattern on the conventional wiring pattern and the wiring pattern fabricated by the method of the present invention in a superimposed manner with direct contact between the two wiring patterns, and/or a crossover portion of the wiring pattern on the conventional wiring pattern and the wiring pattern fabricated by the method of the present invention, with the resist coating being interposed therebetween, but in a superimposed manner without direct contact between the two wiring patterns. In other words, only by the presence or the absence of the resist coating, the above-mentioned crossover portion and the above-mentioned junction portion can be selectively formed without difficulty, and therefore a printed circuit with complicated wiring patterns can be produced easily at low cost.

The above-mentioned bumps and/or the wiring pattern can be easily formed on a substrate, for instance, by an apparatus, which is capable of (a) bringing an intaglio printing master having bump female die portions and/or groove portions corresponding to the wiring pattern, each in a printing shape, depressed below the surface of the printing master, in which bump female die portions and/or the groove portions a paste or a fused metal is filled, into close contact with a print receiving material, and (b) separating the intaglio printing master from the print receiving material to transfer the paste or the fused metal in the printing shape to the print receiving material, comprising:

(1) an airtight housing for holding therein the paste or the fused metal, provided with a vacant space therein, (2) means for decreasing or increasing the pressure in the vacant space of the airtight housing, (3) a shielding plate which can be brought into close and sliding contact with the surface of the printing master which is immersed in the paste or the fused metal to remove the paste or the fused metal therefrom and to close the openings of the bump female die portions and/or the groove portions in which the paste or the fused metal is filled, with the shielding plate, (4) means for immersing the intaglio printing master in the paste or the fused metal placed in the airtight housing, to fill the bump female die portions and/or the groove portions with the paste or the fused metal, (5) means for bringing the shielding plate into close and sliding contact with the surface of the printing master to remove the paste or the fused metal therefrom and to close the openings of the bump female die portions and/or the groove portions in which the paste or the fused metal is filled, with the shielding plate, (6) means for taking out the printing master to which the shielding plate is closely attached from the paste or the fused metal, (7) means for separating the shielding plate from the surface of the printing master, (8) means for bringing the printing master free of the shielding plate into close contact with the print receiving material, and (9) means for separating the printing master from the print receiving material to transfer the paste or the fused metal in the printing shapes to the print receiving material.

The wiring pattern can also be formed on a front or back side of a printed circuit board and/or on a resist-coated substrate with the formation of a junction portion and/or a crossover portion in the wiring pattern, using an intaglio printing master having groove portions depressed below the surface of the printing master, in a printing shape corresponding to the wiring pattern, by the intaglio printing method of the present invention.

A bump electrode formed by the method of the present invention comprises a bump made from a fused metal in the shape of a circular cylinder, a cone or pyramide or a frustum of a cone or pyramid, formed on a substrate.

A printed circuit board fabricated by using the above-mentioned method of the present invention comprises a substrate and a wiring pattern provided thereon which is made from a paste or a fused metal, having a cross-section at right angles with respect to the extending direction of said wiring pattern with such an aspect ratio of the depth thereof to the width thereof that the depth thereof is greater than and the width thereof is smaller than the respective depth and width of an aspect ratio of 1:5.

Another printed circuit board fabricated by using the above-mentioned method of the present invention comprises a printed circuit substrate, a first wiring pattern and/or a resist coating formed on a front side or a back side of the printed circuit substrate, and a second wiring pattern made from a paste or a fused metal, which is formed on the first wiring pattern and/or the resist coating, thereby forming a junction portion of the first wiring pattern and the second wiring pattern and/or a crossover portion of the first wiring pattern and the second wiring pattern with the resist coating interposed therebetween.

In the above printed circuit board, the second wiring pattern which is made from a paste or a fused metal may have a cross-section at right angles with respect to the extending direction of the wiring pattern with such an aspect ratio of the thickness thereof to the width thereof that the thickness thereof is greater than and the width thereof is smaller than the respective thickness and width of an aspect ratio of 1:5.

In the intaglio printing method of the present invention may comprises the steps of (a) bringing an intaglio printing master having portions depressed in a printing shape below the surface of the printing master, in which depressed portions a paste or a fused metal is filled, into close contact with a print receiving material, and (b) separating the intaglio printing master from the print receiving material to transfer the paste or the fused metal in the printing shape to the print receiving material, it is preferable that the intaglio printing master having the depressed portions be made of a plastic material.

In the above-mentioned intaglio printing method, it is more preferable that the plastic material be elastic.

In the intaglio printer of the present invention, which is capable of (a) bringing an intaglio printing master having portions depressed in a printing shape below the surface of the printing master, in which depressed portions a paste or a fused metal is filled, into close contact with a print receiving material, and (b) separating the intaglio printing master from the print receiving material to transfer the paste or the fused metal to the print receiving material, it is preferable that the intaglio printing master having the depressed portions be made of a plastic material.

In the above-mentioned intaglio printer, it is more preferable that the plastic material be elastic.

Other features of this invention will become apparent in the course of the following description of exemplary embodiments, which are given for illustration of the invention and are not intended to be limiting thereof.

FIG. 1 is a schematic cross-sectional view of an apparatus in explanation of the intaglio printing method of the present invention.

In FIG. 1, below an airtight housing 1, there is disposed a fused metal container 2 in which a fused metal 3, such as a eutectic solider or a high-temperature solider, serving as a material for a wiring pattern or a bump electrode, is held at a temperature of the melting point of the fused metal or above. In an upper portion of the inside of the housing 1, an inert gas 4 such as nitrogen gas for preventing the oxidation of the fused metal 3 is filled.

In Step A in FIG. 1, an intaglio printing master 5 made of a plastic material with slight elasticity, having depressed portions 6 in a printing shape, is placed in the inert gas 4 within the airtight housing 1. By reducing the pressure of the inert gas 4 by a pressure increasing and decreasing apparatus 7, gases remaining in the depressed portions 6 are removed therefrom. The thus deaerated intaglio printing master 5 is then immersed in the fused metal 3. The pressure of the inert gas 4 is increased by the pressure increasing and decreasing apparatus 7, whereby pressure is applied to the fused metal 3, so that the fused metal 3 is completely filled in the depressed portions 6 without remaining any unfilled space in the depressed portions 6.

In Step B, after the complete filling of the fused metal 3 in the depressed portions 6, a shielding plate 8 having a flat surface is brought into close and sliding contact with the surface of the printing master 5 in such a manner that the flat surface of the shielding plate 8 comes into contact with the surface of the printing master 5 on the side of the openings of the depressed portions 6 of the printing master 5, thereby removing the fused metal 3 staying on the surface of the printing master 5 therefrom, closing the openings of the depressed portions 6 of the printing master 5 with the shielding plate 8, whereby the fused metal 3 is completely removed from between the surface of the printing master 5 and the shielding plate 8, and a constant amount of the fused metal 3 is always filled in the depressed portions 6.

In Step C, the printing master 5 with the fused metal being filled in the depressed portions 6 is taken out from the fused metal 3, together with the shielding plate 8 which is closely attached to the printing master 5, and then the printing master 5 is horizontally positioned in such a posture that the depressed portions 6 thereof come upward as illustrated. The shielding plate 8 is then slid in the direction of the arrow so as to remove the shielding plate 8 from the printing master 5.

In Step D, a print receiving material 10 such as a package which is preheated for easing heat shock, with the printing side thereof being directed downward, is brought into close contact with the printing master 5 at a predetermined position, and the print receiving material 10 which is in close contact with the printing master 5 is turned upside-down. Sight pressure is applied to the printing master 5 and the print receiving material 10 by a pressure application apparatus 11. Due to the elasticity of the printing master 5 made of a plastic material, the fused metal 3 filled in the depressed portions 6 of the printing master 5 is securely brought into close contact with the print receiving material 10.

In Step E, the printing master 5 and the print receiving material 10 are gradually cooled, and the fused metal 3 in the depressed portions 6 is solidified. The printing master 5 is then separated from the print receiving material 10, whereby the fused metal 8 filled in the depressed portions of the printing master 5 is transferred in the printing shape corresponding to the shape of the depressed portions 6 to the print receiving material 10 such as a package.

Thus, for example, by use of the printing master 5 having bump female die portions as the depressed portions 5 in the printing shape, bumps for BGA and CSF packages, and connection bumps of flip chip can be produced at low cost and with high uniformity.

It can be considered that the depressed portions 6 of the printing master 5 can be formed by various methods such as mechanical working, photolithography, or plating. However, these methods have the shortcomings that the finer the bumps and the wiring patter, the more difficult the production, and the higher the production cost. These problems can be solved by forming the depressed portions in the printing shape in a plastic plate, using excimer laser, since fine and small bump female die portions and grooves corresponding to a fine wiring pattern in a printing shape, depressed below the surface of the plastic plate, can be precisely formed by excimer laser engraving work.

Figure 2A:
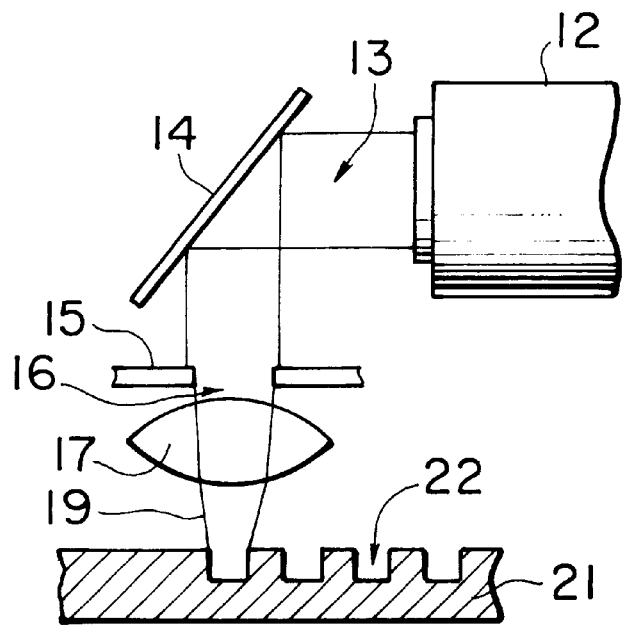
FIG. 2a and FIG. 2b are schematic diagrams in explanation of an example of the formation of depressed portions in an intaglio printing master, using excimer laser.
Figure 2B:
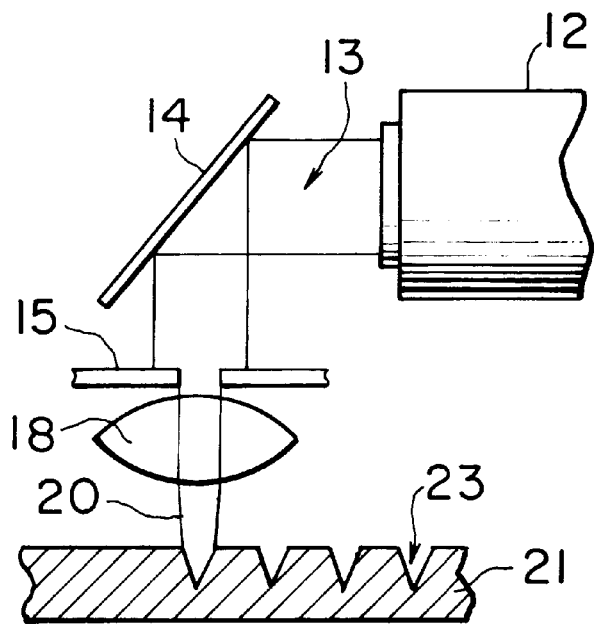

FIG. 2a and FIG. 2b are schematic diagrams in explanation of an example of the formation of depressed portions in an intaglio printing master, using excimer laser.

In FIG. 2a and FIG. 2b, a laser beam 13 emitted from an excimer laser generator 12 is corrected with respect to the traveling direction and the aberration of the optical axis thereof by a mirror 14 placed in the optical path of the laser beam 13, and then subjected to form adjustment by a light shielding plate 15 for pattern setting, and patterned to form a patterned excimer laser beam 16. The excimer laser beam 16 is then condensed so as to have a necessary energy density, and projected to the surface of a plastic plate 21 which is to be used as an intaglio printing master, whereby abrasion working is carried out on the plastic plate 21.

As a result, as shown in FIG. 2a, a worked hole 22 with a small tapering is formed by an excimer laser beam 19 which is condensed so as to have a high energy density by an image lens 17 with a large condensation ratio, while as shown in FIG. 2b, a worked hole 23 with a large tapering is formed by an excimer laser beam 20 which is condensed so as to have a low energy density by an image lens 18 with a small condensation ratio.

Figure 3A:
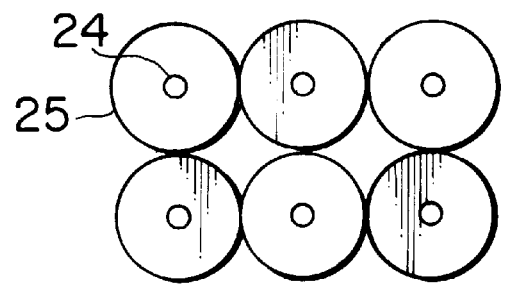
FIG. 3a to FIG. 3c are schematic diagrams in explanation of the principle of the abrasion working by excimer laser.
Figure 3B:
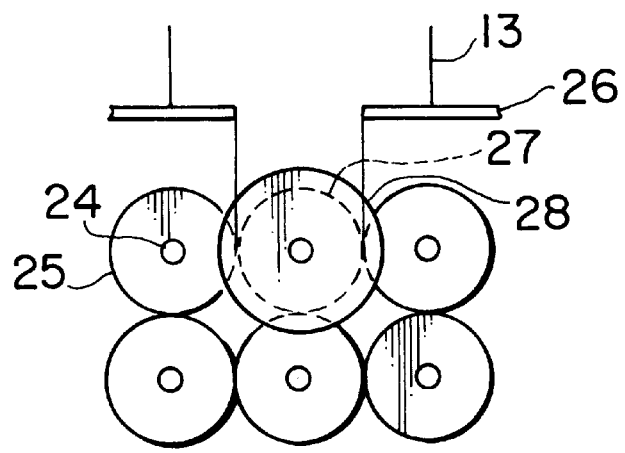
Figure 3C:
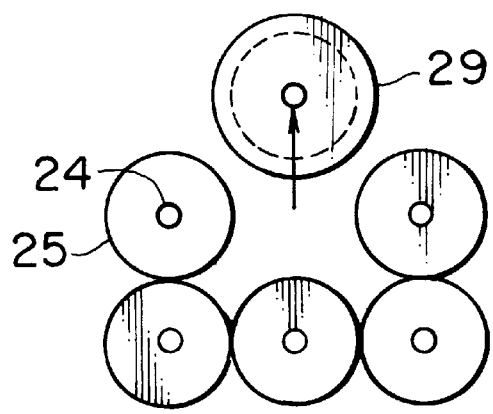

FIG. 3a to FIG. 3c are schematic diagrams in explanation of the abrasion working by excimer laser.

As shown in FIG. 3a, a polymeric material such as a plastic material is composed of atoms 24 with the formation of covalent bonds therebetween with the electron orbitals 25 of the atoms overlapping sharing electrons so as to have a high energy density in the electron orbitals 25 to form a solid matter.

When such a polymeric material is radiated with a laser beam 13 with a radiation range thereof being limited by a light shielding plate 26 as illustrated in FIG. 3b, the ground orbital 27 of the electrons is excited to jump to an outer orbital 28, so that the above-mentioned covalent bonds are ruptured, and abrasion takes place in the polymeric material, and the polymeric material is vaporized with the separation of the polymeric material into individual atoms 29 and rapidly expands within a time as short as about 20 nsec. The thus separated atoms 29 are scattered as illustrated in FIG. 3c, whereby extremely fine abrasion working at a molecular level can be carried out by excimer laser. The excimer laser used in general in such molecular level abrasion working is a short wavelength ultraviolet light of excimer laser with a wavelength of 248 nm for KrF gas, or with a wavelength of 193 nm for ArF gas. Because of the high resolution of the lihgt, extremely fine abrasion working can be carried out.

The excimer laser is a short pulse light, so that the engraving amount is proportional to the number of the pulses applied, and therefore it is possible to form a depressed portion with a predetermined depth in the plastic plate as desired by adjusting the number of the pulses applied thereto without making a through-hole in the plastic plate.

Furthermore, the inner side walls of the engraved depressed portion reflect the excimer laser beam and the absorption energy of the excimer laser beam is attenuated, so that the angle of the side wall of the depressed portion at which an abrasion threshold limit value cannot be not exceeded becomes a working taper. When this is used effectively, the setting of the taper angle of the side wall of the depressed porting can be controlled or adjusted by changing the condensation ratio of the image lens with the replacement of the image lens, increasing or decreasing the output of the laser generator by changing the charging potential thereof, or by adjusting the attenuation ratio of the laser beam by an optical attenuator disposed in the optical path thereto.

Figure 4:
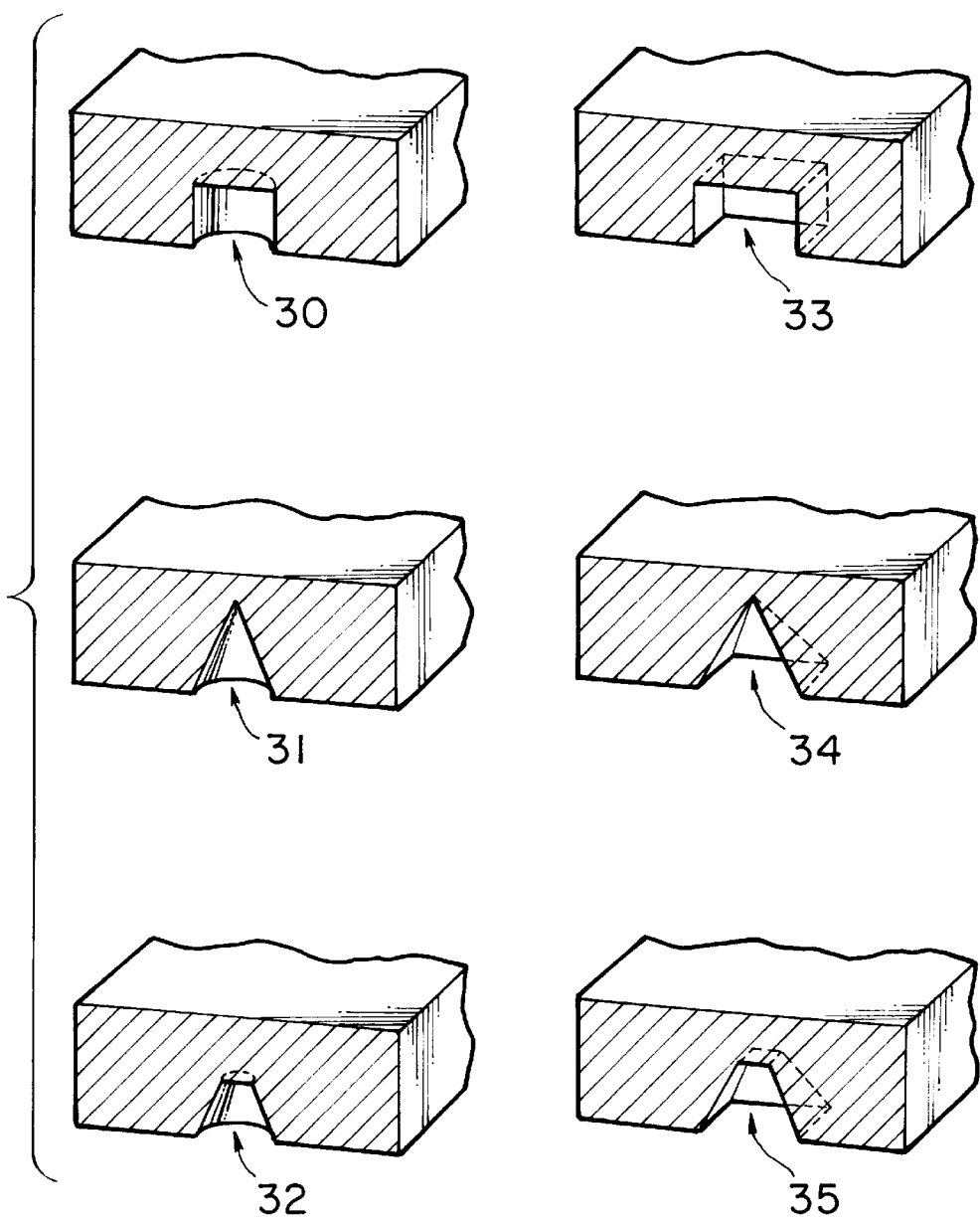
FIG. 4 is a schematic partially-cut-away perspective view of the shapes of various examples of depressed portions of the intaglio printing master of the present invention that can be formed by excimer laser.

Thus, the top angle of a cone formed by the excimer laser can be set as desired, and a conical depressed portion can be formed in the printing shape as desired, regardless of the top angle thereof, with an obtuse angle top or an acute angle top. For instance, as illustrated in FIG. 4, a depressed portion 30 in the shape of a circular cylinder, a depressed portion 31 in the shape of a cone, and a depressed portion 32 in the shape of a frustum of a cone can be easily formed. Furthermore, not only the depressed portions with a circular horizontal cross-section, but also depressed portions with a quadrangular horizontal cross-section, for instance, a depressed portion 33 in the shape of a quadrangular prism, a depressed portion 34 in the shape of a quadrangular pyramid, and a depressed portion 35 in the shape of a frustum of a quadrangular pyramid can be easily formed by excimer laser working, by using the light shielding plate 26 with the opening in the shape corresponding to the above-mentioned respective shape.

Figure 5A:
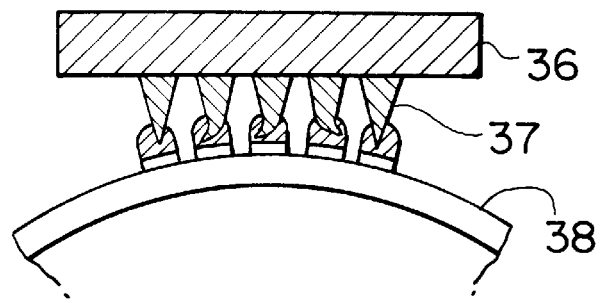
FIG. 5a and FIG. 5b are diagrams in explanation of the effects of conical bumps with an acute top angle.
Figure 5B:
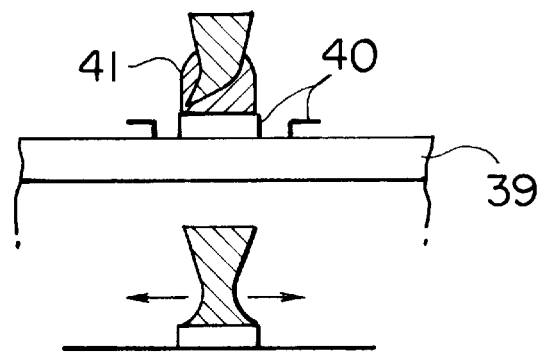

When bumps in the form of a cone with an acute angle top are formed on a semiconductor package 36, by using an intaglio printing master with such depressed portions, in particular, with bump female die portions in the form of a cone with an acute angle top, if a substrate 38 is bent as shown in FIG. 5a, or a pad on the side of the substrate is a pad 40 provided on a substrate 39 with concave and convex portions on the upper surface thereof, the bending and the concave and convex portions can be absorbed by the easy deformation of the thin top end portion 41 of the bump, so that the occurrence of improper junction such as opening, which occurs frequently in the conventional injunction bumps, can be effectively prevented.

Figure 6A:
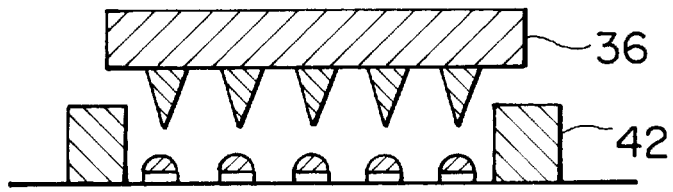
FIG. 6a and FIG. 6b are diagrams in explanation of the formation of pillar-shaped bumps.
Figure 6B:
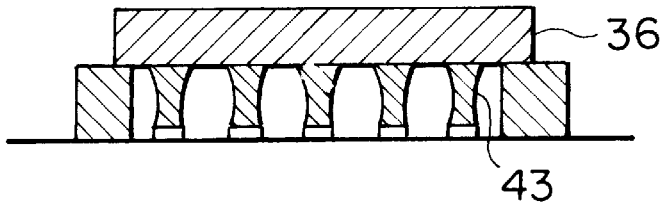

Furthermore, in order to reduce the stress generated by the difference in the thermal coefficient of expansion between the substrate and the package , as shown in FIG. 6a, stud bumps 42 for holding the package at the time of reflow and preventing the dropping of the package, and conical bumps 37 are used in combination, whereby pillar-shaped bumps 43 can be realized as shown in FIG. 6b.

By use of such conical bumps 37, the junction of the pillar-shaped bumps, which is difficult to achieve by the conventional method, can be easily achieved, so that the stress between the substrate and the package as in BGA, CSP and in the bump type junctions as flip chips can be reduced, and the occurrence of cracks in the junction cna be prevented, with the achievement of high reliability.

Furthermore, by use of the printing master 5 with the depressed portions 6 thereof being in the form of grooves corresponding to a wiring pattern to be formed on a printed circuit board Such as a printing wiring board (PWB), the wiring pattern can be formed on the printed circuit board.

In the method of forming such a wiring pattern, the stronger the bonding force between the PWB and the fused metal used for the formation of the wiring pattern, the more advantageous, so that this method is particularly suitable for forming such a wiring pattern on a porous ceramic substrate having numerous fine concave and convex portions on the surface thereof, or on a green sheet used before the preparation of such a porous ceramic substrate.

Furthermore, vibrations, using ultrasonic wave, may be applied to the intaglio printing master 5 which is in close contact with the surface of the substrate, with the fused metal in the depressed portions in the form of grooves being brought into pressure contact with the surface of the substrate, whereby the fixing of the fused metal to the substrate can be enhanced.

When the wiring pattern to be formed is very fine, and the shielding plate 8 for making constant the amount of the fused metal 3 filled in the depressed portions conta corresponding to the wiring pattern comes into contact with the fused metal 3 in the openings of the depressed portions to remove excess fused metal 3 therefrom, there is the risk that the fused metal 3 itself is separated into countless particles by the surface tension of the fused metal 3 and the wiring pattern to be continuously formed becomes discontinuous. In such a case, when the printing master 5 with which the shielding plate 8 is in close contact, with the openings of the depressed portions being closed with the shielding plate 8, is taken out of the fused metal container 2, the shielding plate 8 is removed from the surface of the printing master 5 after the fused metal 3 is cooled and solidified. Thereafter, the printing master 5 is brought into close contact with the substrate for PWB and then heated again to fuse the solidified metal and then cooled with the application of slight pressure thereto by the pressure application apparatus 11. When the fused metal 3 is solidified, the printing master 5 is separated from the substrate, whereby a fine wiring pattern can be formed precisely and easily.

By forming grooves corresponding to the wiring pattern in the plastic plate by excimer laser, the width and the depth of the grooves can be changed as desired and also the aspect ratio of the thickness and the width of the wiring pattern can also be easily changed as desired.

In the subtractive method, which is currently most used for the production of printed circuit boards, the standard thickness of a copper foil used in the upper most surface portion of printed circuit boards is 18 $\mu$m. , On the other hand, the width of the wiring pattern is still about 100 $\mu$m, so that the aspect ratio of the thickness to the width of the cross-section of the wiring pattern is about 1:5, which indicates that the wiring pattern is in a thin and broad shape.

In the PWB substrate fabricated by using the intaglio printing master 5 having grooves which exactly correspond to the printing shape of the wiring pattern and the fused metal 3, the cross-section of the wiring pattern can be change and adjusted by changing the shape of the grooves, so that it is possible to change the thickness of the cross-section of the wiring pattern so as to be greater than that of the aspect ratio of 1:5. In other words, it is possible to form a wiring pattern having a cross-section with a thickness which is larger than the width thereof on the PWB substrate, which is difficult to achieve by conventional methods.

Thus, the width of the wiring pattern can be reduced without changing the cross-section of the wiring pattern by the present invention, So that it is possible to form a wiring pattern with high density while maintaining the low resistance thereof.

According to the above-mentioned method of forming the bumps and/or the wiring pattern, the bumps and/or the wiring pattern can be easily obtained by repeatedly filling the depressed portions in a printing shape with the paste or the fused metal, and exceedingly higher productivity can be attained in comparison with other production methods. Furthermore, the materials for the bumps and the wiring pattern for use in this method are inexpensive. It is also possible that ingots or line materials for automatic feeding can be used as they are as the materials for the bumps and the wiring pattern. Furthermore, as auxiliary materials, no materials other than inexpensive gas such as nitrogen and a mask cleaning agent for the intaglio printing master are necessary, so that bumps and the wiring pattern can be formed on boards and substrates such as semiconductor package at low cost.

Furthermore, the above-mentioned method of forming the bumps and/or the wiring pattern can be carried out by using a simple apparatus, so that for example, the formation of bumps on the packages can be carried out in actual assembly lines, and while the heat at the formation of the bumps is still high, the mounting and the passage through a reflow furnace of the package can be performed, whereby the number of heat shocks, which is a conventional problem when guaranteeing the quality of the package, can be significantly reduced.

In the above, the case where the fused metal is used is explained. As mentioned above, it is also possible to use pastes. Representative examples of the pastes are electroconductive adhesive agent, anisotropic electroconductive adhesive agent, electroconductive polymer, cream solder, tin paste, silver paste, silver palladium paste, and carbon paste. When electroconductive adhesive agent, anisotropic electroconductive adhesive agent, electroconductive polymer, and carbon paste are used, it is unnecessary to fuse such pastes, and therefore heating and cooling of the pastes to be performed after the fusing are unnecessary. It is only necessary to separate the intaglio printing master from the boards or packages after the hardening of the paste.

In contrast, when cream solder, tin paste, silver paste, and silver palladium paste are used, any of these is filled in the depressed portions of the intaglio printing master at room temperature, and the intaglio printing master is brought into close contact with a substrate, and is subjected to reflow with the intaglio printing master being in contact with the substrate to fuse the paste The fused paste is then cooled and solidified, and then the intaglio printing master is separated from the substrate.

Figure 7:
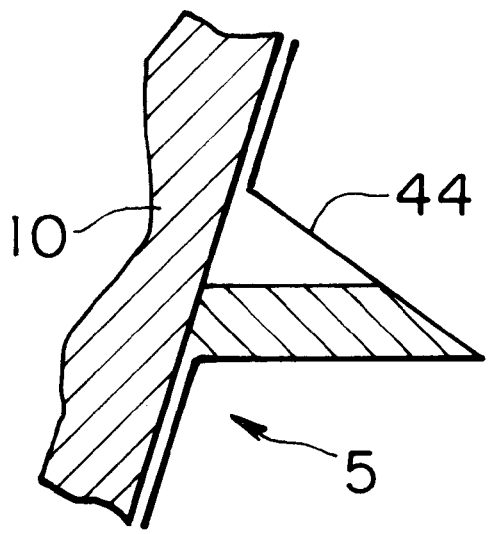
FIG. 7 is a diagram in explanation of the formation of a conical bump by a turning method.

When such a paste that needs the fusing thereof is used, the package or the substrate is usually placed with the print receiving side thereof up, and the intaglio printing master is overlaid thereon with the openings of the depressed portions of the printing master down, in close contact with the print receiving side of the substrate or the package, followed by the reflow. When conical bumps for BGA and CSF are formed, it is preferable that the heating, fusing, cooling and solidification be conducted, with the package as a print receiving material 10 and the intaglio printing master being situated in a slanting position in the longitudinal direction of the bumps as shown in FIG. 7.

The pastes which require the fusing contain a flux in an amount of about 50%, so that the fused metal cannot occupy the entire space of the depressed portions of the intaglio printing master 5. Therefore, when the bumps are formed with the top end portions being directed upward, the upper end portion of the depressed portions 6 is filled with a flux with a smaller specific gravity, so that bumps without the top end portions are formed. However, in the method of forming conical bumps with the intaglio printing master 5 being turned sideways, a lacking portion 44 at the top end can be moved to one side of the conical bumps, so that the shape of the pillar-shaped bumps after the reflow is substantially the same as the shape of the pillar-shaped bumps after the reflow which can be achieved by the conical bump shape, and the effect of reducing the stress can be maintained.

Figure 8:
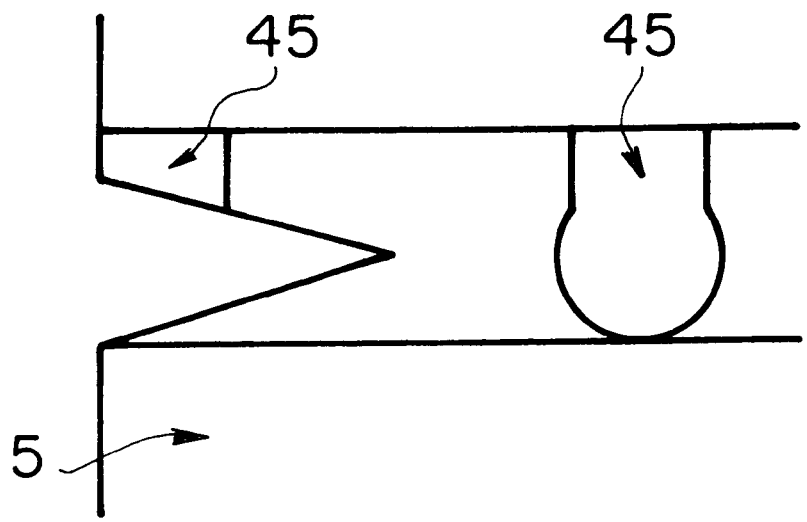
FIG. 8 is a diagram in explanation of a bump female die portion for preventing the formation of a lacking portion at a side surface of a conical bump.

The lacking portion 44 on the side of the conical bump can be avoided to some extent by modifying the bump female die portion so as to expand toward the upper portion thereof as shown in FIG. 8, in such a shape of a bump lacking auxiliary filling shape 45. Japanese Patent Application No. 9-053948 filed Feb. 21, 1997, is hereby incorporated by reference.

What is claimed is:

1. An intaglio printing method comprising the steps of (a) bringing an intaglio printing master having portions depressed in a printing shape below the surface of said printing master, in which depressed portions a paste or a fused metal is filled, into close contact with a print receiving material which can receive said paste or said fused metal, and (b) separating said intaglio printing master from said print receiving material to transfer said paste or said fused metal to said print receiving material, wherein said intaglio printing method further comprises the steps of:

(1) immersing said intaglio printing master having said depressed portions in said paste or said fused metal to fill said depressed portions with said paste or said fused metal, (2) bringing a shielding plate into close and sliding contact with the surface of said printing master to remove therefrom said paste or said fused metal and to close, with said shielding plate, the openings of said depressed portions in which said paste or said fused metal is filled, (3) taking out said printing master to which said shielding plate is closely attached from said paste or said fused metal, (4) separating said shielding plate from the surface of said printing master, (5) bringing said printing master free of said shielding plate into close contact with said print receiving material, and (6) separating said printing master from said print receiving material to transfer said paste or said fused metal in said printing shape to said print receiving material.

2. The intaglio printing method as claimed in claim 1, wherein in the step (1) of immersing said intaglio printing master having said depressed portions in said paste or said fused metal, pressure is applied to said paste or said fused metal to fill said depressed portions with said paste or said fused metal.

3. The intaglio printing method as claimed in claim 2, further comprising the step of placing said intaglio printing master in vacuum or in an atmosphere of reduced pressure prior to the step of immersing said intaglio printing master having said depressed portions in said paste or said fused metal with the application of pressure thereto.

4. The intaglio printing method as claimed in claim 3, wherein said atmosphere of reduced pressure is an atmosphere of an inert gas.

5. The intaglio printing method as claimed in claim 1, further comprising the step of placing said intaglio printing master in vacuum or in an atmosphere of reduced pressure prior to the step (1) of immersing said intaglio printing master having said depressed portions in said paste or said fused metal.

6. The intaglio printing method as claimed in claim 5, wherein said atmosphere of reduced pressure is an atmosphere of an inert gas.

7. The intaglio printing method as claimed in claim 1, wherein the step (5) of bringing said printing master free of said shielding plate into close contact with said print receiving material, and the step (6) of separating said printing master from said print receiving material to transfer said paste or said fused metal in said printing shape to said print receiving material, are carried out while said paste in said depressed portions is in an unsolidified state, or while said fused metal in said depressed portions is still in a fused state.

8. The intaglio printing method as claimed in claim 1, wherein the step (5) of bringing said printing master free of said shielding plate into close contact with said print receiving material is carried out while said paste in said depressed portions is in an unsolidified state, or while said fused metal in said depressed portions is still in a fused state, and the step (6) of separating said printing master from said print receiving material to transfer said paste or said fused metal in said printing shape to said print receiving material is carried out after said paste or said fused metal in said depressed portions is in a solidified state.

9. The intaglio printing method as claimed in claim 1, wherein the step (5) of bringing said printing master free of said shielding plate into close contact with said print receiving material is carried out with said printing master being in pressure contact with said print receiving material.

10. The intaglio printing method as claimed in claim 1, wherein immediately after the step (3) of taking out said printing master to which said shielding plate is closely attached from said fused metal, said fused metal in said depressed portions is cooled below the melting point of said fused metal, and the step (4) of separating said shielding plate from the surface of said printing master is performed, and in the step (5) of bringing said printing master free of said shielding plate into close contact with said print receiving material, said cooled metal is heated to the melting point of said metal or above, and then cooled below the melting point of said metal, at that moment, said printing master is separated from said print receiving material to transfer said fused metal in said printing shape to said print receiving material.

11. The intaglio printing method as claimed in claim 1, wherein said intaglio printing master having portions depressed in said printing shape below the surface of said printing master is made of a plastic material.

12. The intaglio printing method as claimed in claim 11, wherein said portions depressed in said printing shape below the surface of said printing master are formed by excimer laser working.

13. The intaglio printing method as claimed in claim 1, wherein said intaglio printing master having portions depressed in said printing shape below the surface of said printing master is made of an elastic plastic material.

14. The intaglio printing method as claimed in claim 13, wherein said portions depressed in said printing shape below the surface of said printing master are formed by excimer laser working.

15. An intaglio printer capable of (a) bringing an intaglio printing master having portions depressed in a printing shape below the surface of said printing master, in which depressed portions a paste or a fused metal is filled, into close contact with a print receiving material which can receive said paste or said fused metal, and (b) separating said intaglio printing master from said print receiving material to transfer said paste or said fused metal to said print receiving material, comprising;

(1) an airtight housing for holding therein said paste or said fused metal, provided with a vacant space therein, (2) means for decreasing or increasing the pressure in said vacant space of said airtight housing, (3) a shielding plate which can be brought into close and sliding contact with the surface of said printing master which is immersed in said paste or said fused metal to remove said paste or said fused metal therefrom and to close the openings of said depressed portions in which said paste or said fused metal is filled, (4) means for immersing said intaglio printing master having portions depressed in said printing shape below the surface of said printing master in said paste or said fused metal which is placed in said airtight housing, to fill said depressed portions with said paste or said fused metal, (5) means for bringing said shielding plate into close and sliding contact with the surface of said printing master, thereby removing said paste or said fused metal therefrom and closing the openings of said depressed portions in which said paste or said fused metal is filled, with said shielding plate, (6) means for taking out said printing master to which said shielding plate is closely attached from said paste or said fused metal, (7) means for separating said shielding plate from the surface of said printing master, (8) means for bringing said printing master free of said shielding plate into close contact with said print receiving material, and (9) means for separating said printing master from said print receiving material to transfer said paste or said fused metal in said printing shape to said print receiving material.

16. A method of forming bumps on a substrate, using an intaglio printing master having bump female die portions in a printing shape depressed below the surface of said printing master, by an intaglio printing method comprising the steps of (a) bringing said intaglio printing master, with a paste or a fused metal being filled in said bump female die portions, into close contact with a print receiving material which can receive said paste or said fused metal, and (b) separating said intaglio printing master from said print receiving material to transfer said paste or said fused metal to said print receiving material, wherein said intaglio printing method further comprises the steps of:

(1) immersing said intaglio printing master having said bump female die portions in said printing shape in said paste or said fused metal to fill said bump female die portions with said paste or said fused metal, (2) bringing a shielding plate into close and sliding contact with the surface of said printing master to remove said paste or said fused metal therefrom and to close the openings of said bump female die portions in which said paste or said fused metal is filled, with said shielding plate, (3) taking out said printing master to which said shielding plate is closely attached from said paste or said fused metal, (4) separating said shielding plate from the surface of said printing master, (5) bringing said printing master free of said shielding plate into close contact with said print receiving material, and (6) separating said printing master from said print receiving material to transfer said paste or said fused metal in said printing shape to said print receiving material.

17. The method as claimed in claim 16, wherein in the step (1) of immersing said intaglio printing master having bump female die portions in said printing shape in said paste or said fused metal, pressure is applied thereto to fill said bump female die portions with said paste or said fused metal.

18. The method as claimed in claim 17, further comprising the step of placing said intaglio printing master in vacuum or in an atmosphere of reduced pressure prior to the step of immersing said intaglio printing master having said bump female die portions in said printing shape in said paste or said fused metal with the application of pressure thereto to fill said bump female die portions with said paste or said fused metal.

19. The method as claimed in claim 18, wherein said atmosphere of reduced pressure is an atmosphere of an inert gas.

20. The method as claimed in claim 16, further comprising the step of placing said intaglio printing master in vacuum or in an atmosphere of reduced pressure prior to the step (1) of immersing said intaglio printing master having said bump female die portions in said printing shape in said paste or said fused metal to fill said bump female die portions with said paste or said fused metal.

21. The method as claimed in claim 20, wherein said atmosphere of reduced pressure is an atmosphere of an inert gas.

22. The method as claimed in claim 16, wherein the step (5) of bringing said printing master free of said shielding plate into close contact with said print receiving material, and the step (6) of separating said printing master from said print receiving material to transfer said paste or said fused metal in said printing shape to said print receiving material, are carried out while said paste in said bump female die portions is in an unsolidified state, or while said fused metal in said bump female die portions is still in a fused state.

23. The method as claimed in claim 16, wherein the step (5) of bringing said printing master free of said shielding plate into close contact with said print receiving material is carried out while said paste in said bump female die portions is in an unsolidified state, or while said fused metal in said bump female die portions is still in a fused state, and the step (6) of separating said printing master from said print receiving material to transfer said paste or said fused metal in said printing shape to said print receiving material is carried out after said paste or said fused metal in said bump female die bump female die portions is in a solidified state.

24. The method as claimed in claim 16, wherein the step (5) of bringing said printing master free of said shielding plate into close contact with said print receiving material is carried out with said printing master being in pressure contact with said print receiving material.

25. The method as claimed in claim 16, wherein immediately after taking out said printing master to which said shielding plate is closely attached from said fused metal, said fused metal in said depressed portions is cooled below the melting point of said fused metal, and the step (4) of separating said shielding plate from the surface of said printing mater is performed, and in the step (5) of bringing said printing master free of said shielding plate into close contact with said print receiving material, said cooled metal is heated to the melting point of said metal or above, and then cooled below the melting point of said metal, at that moment, said printing master is separated from said print receiving material to transfer said fused metal in said printing shape to said print receiving material.

26. The method as claimed in claim 16, wherein said intaglio printing master having bump female die portions is made of a plastic material.

27. The method as claimed in claim 26, wherein said bump female die portions of said intaglio printing master are formed by excimer laser working.

28. The method as claimed in claim 26, wherein said bump female die portions of said intaglio printing master are formed into the shape of a circular cylinder, a cone or pyramid, or a frustum of a cone or pyramid by excimer laser working.

29. The method as claimed in claim 16, wherein said intaglio printing master having bump female die portions is made of an elastic plastic material.

30. The method as claimed in claim 29, wherein said bump female die portions of said intaglio printing master are formed by excimer laser working.

31. The method as claimed in claim 29, wherein said bump female die portions of said intaglio printing master are formed into the shape of a circular cylinder, a cone or pyramid, or a frustum of a cone or pyramid by excimer laser working.

32. A method of forming a wiring pattern on a substrate, using an intaglio printing master having groove portions depressed below the surface of said printing master, in a printing shape corresponding to said wiring pattern, by an intaglio printing method comprising the steps of (a) bringing said intaglio printing master, with a paste or a fused metal being filled in said groove portions, into close contact with a print receiving material which can receive said paste or said fused metal, and (b) separating said intaglio printing master from said print receiving material to transfer said paste or said fused metal to said print receiving material, wherein said intaglio printing method further comprises the steps of:

(1) immersing said intaglio printing master having said groove portions in said printing shape in said paste or said fused metal to fill said groove portions with said paste or said fused metal, (2) bringing a shielding plate into close and sliding contact with the surface of said printing master to remove said paste or said fused metal therefrom and to close the openings of said groove portions in which said paste or said fused metal is filled, with said shielding plate, (3) taking out said printing master to which said shielding plate is closely attached from said paste or said fused metal, (4) separating said shielding plate from the surface of said printing master, (5) bringing said printing master free of said shielding plate into close contact with said print receiving material, and (6) separating said printing master from said print receiving material to transfer said paste or said fused metal in said printing shape to said print receiving material.

33. The method as claimed in claim 32, wherein in the step (1) of immersing said intaglio printing master having said groove portions in said printing shape in said paste or said fused metal, pressure is applied thereto to fill said groove portions with said paste or said fused metal.

34. The method as claimed in claim 33, further comprising the step of placing said intaglio printing master in vacuum or in an atmosphere of reduced pressure prior to the step of immersing said intaglio printing master having said groove portions in said printing shape in said paste or said fused metal with the application of pressure thereto to fill said groove portions with said paste or said fused metal.

35. The method as claimed in claim 34, wherein said atmosphere of reduced pressure is an atmosphere of an inert gas.

36. The method as claimed in claim 32, further comprising the step of placing said intaglio printing master in vacuum or in an atmosphere of reduced pressure prior to the step (1) of immersing said intaglio printing master having said groove portions in said printing shape in said paste or said fused metal to fill said groove portions with said paste or said fused metal.

37. The method as claimed in claim 36, wherein said atmosphere of reduced pressure is an atmosphere of an inert gas.

38. The method as claimed in claim 32, wherein the step (5) of bringing said printing master free of said shielding plate into close contact with said print receiving material, and the step (6) of separating said printing master from said print receiving material to transfer said paste or said fused metal in said printing shape to said print receiving material, are carried out while said paste in said groove portions is in an unsolidified state, or while said fused metal in said groove portions is still in a fused state.

39. The method as claimed in claim 32, wherein the step (5) of bringing said printing master free of said shielding plate into close contact with said print receiving material is carried out while said paste in said groove portions is in an unsolidified state, or while said fused metal in said groove portions is still in a fused state, and the step (6) of separating said printing master from said print receiving material to transfer said paste or said fused metal in said printing shape to said print receiving material is carried out after said paste or said fused metal in said groove portions is in a solidified state.

40. The method as claimed in claim 32, wherein the step (5) of bringing said printing master free of said shielding plate into close contact with said print receiving material is carried out with said printing master being in pressure contact with said print receiving material.

41. The method as claimed in claim 32, wherein immediately after the step (3) of taking out said printing master to which said shielding plate is closely attached from said fused metal, said fused metal in said groove portions is cooled below the melting point of said fused metal, and the step (4) of separating said shielding plate from the surface of said printing mater is performed, and in the step (5) of bringing said printing master free of said shielding plate into close contact with said print receiving material, said cooled metal is heated to the melting point of said metal or above, and then cooled below the melting point of said metal, at that moment, said printing master is separated from said print receiving material to transfer said fused metal in said printing shape to said print receiving material.

42. The method as claimed in claim 32, wherein said intaglio printing master having said groove portions is made of a plastic material.

43. The method as claimed in claim 42, wherein said groove portions of said intaglio printing master are formed by excimer laser working.

44. The method as claimed in claim 42, wherein said groove portions of said intaglio printing master are formed into the shape of a circular cylinder, a cone or pyramid, or a frustum of a cone or pyramid by excimer laser working.

45. The method as claimed in claim 32, wherein said intaglio printing master having said groove portions is made of an elastic plastic material.

46. The method as claimed in claim 45, wherein said groove portions of said intaglio printing master are formed by excimer laser working.

47. The method as claimed in claim 45, wherein said groove portions of said intaglio printing master are formed into the shape of a circular cylinder, a cone or pyramid, or a frustum of a cone or pyramid by excimer laser working.

48. The method as claimed in claim 32, wherein said groove portions have cross-sections at right angles with respect to extending directions of said groove portions with such an aspect ratio of the depth thereof to the width thereof that the depth thereof is greater than and the width thereof is smaller than the respective depth and width of an aspect ratio of 1:5.

49. A method of forming one of bumps and a wiring pattern on a substrate, using an intaglio printing master having one of bump female die portions and groove portions corresponding to said wiring pattern, each in a printing shape, depressed below the surface of said printing master, by an intaglio printing method comprising the steps of (a) bringing said intaglio printing master, with one of a paste and a fused metal being filled in said one of the bump female die portions and said groove portions, into close contact with a print receiving material, and (b) separating said intaglio printing master from said print receiving material to transfer said one of the paste and said fused metal to said print receiving material, wherein said intaglio printing method further comprises the steps of:

(1) immersing said intaglio printing master having said one of the bump female die portions and said groove portions, each in said printing shapes, in said one of the paste and said fused metal to fill said one of the bump female die portions and said groove portions with said one of the paste and said fused metal, (2) bringing a shielding plate into close and sliding contact with the surface of said printing master to remove said one of the paste and said fused metal therefrom and to close the openings of said one of the bump female die portions and the openings of said groove portions in which said one of the paste and said fused metal is filled, with said shielding plate, (3) taking out said printing master to which said shielding plate is closely attached from said one of the paste and said fused metal, (4) separating said shielding plate from the surface of said printing master, (5) bringing said printing master free of said shielding plate into close contact with said print receiving material, and (6) separating said printing master from said print receiving material to transfer said one of the paste and said fused metal in said printing shapes to said print receiving material.

50. The method as claimed in claim 49, wherein in the step (1) of immersing said intaglio printing master having said one of the bump female die portions and said groove portions in said printing shapes in said one of the paste and said fused metal, pressure is applied thereto to fill said one of the bump female die portions and said groove portions with said one of the paste and said fused metal.

51. The method as claimed in claim 50, further comprising the step of placing said intaglio printing master in one of a vacuum and an atmosphere of reduced pressure prior to the step of immersing said intaglio printing master having said one of the bump female die portions and said groove portions, each in said printing shape, in said one of the paste and said fused metal with the application of pressure thereto to fill said one of the bump female die portions and said groove portions with said one of the paste and said fused metal.

52. The method as claimed in claim 51, wherein said atmosphere of reduced pressure is an atmosphere of an inert gas.

53. The method as claimed in claim 49, further comprising the step of placing said intaglio printing master in one of a vacuum and an atmosphere of reduced pressure prior to the step (1) of immersing said intaglio printing master having said one of the bump female die portions and said groove portions, each in said printing shape, in said one of the paste and said fused metal to fill said one of the bump female die portions and said groove portions with said one of the paste and said fused metal.

54. The method as claimed in claim 53, wherein said atmosphere of reduced pressure is an atmosphere of an inert gas.

55. The method as claimed in claim 49, wherein the step (5) of bringing said printing master free of said shielding plate into close contact with said print receiving material, and the step (6) of separating said printing master from said print receiving material to transfer said one of the paste and said fused metal in said printing shapes to said print receiving material, are carried out while said paste in said one of the bump female die portions and said groove portions is in an unsolidified state, or while said fused metal in said one of the bump female die portions and said groove portions is still in a fused state.

56. The method as claimed in claim 49, wherein the step (5) of bringing said printing master free of said shielding plate into close contact with said print receiving material is carried out while said paste in said one of the bump female die portions and said groove portions is in an unsolidified state, or while said fused metal in said one of the bump female die portions and said groove portions is still in a fused state, and the step (6) of separating said printing master from said print receiving material to transfer said one of the paste and said fused metal in said printing shapes to said print receiving material is carried out after said one of the paste and said fused metal in said one of the bump female die portions and said groove portions is in a solidified state.

57. The method as claimed in claim 49, wherein the step (5) of bringing said printing master free of said shielding plate into close contact with said print receiving material is carried out with said printing master being in pressure contact with said print receiving material.

58. The method as claimed in claim 49, wherein immediately after taking out said printing master to which said shielding plate is closely attached from said fused metal, said fused metal in said one of the bump female die portions and said groove portions is cooled below the melting point of said fused metal, and the step (4) of separating said shielding plate from the surface of said printing mater is performed, and in the step (5) of bringing said printing master free of said shielding plate into close contact with said print receiving material, said cooled metal is heated to the melting point of said metal or above, and then cooled below the melting point of said metal, at that moment, said printing master is separated from said print receiving material to transfer said fused metal in said printing shape to said print receiving material.

59. The method as claimed in claim 49, wherein said intaglio printing master having said one of the bump female die portions and said groove portions is made of a plastic material.

60. The method as claimed in claim 59, wherein said one of the bump female die portions and said groove portions of said intaglio printing master are formed by excimer laser working.

61. The method as claimed in claim 49, wherein said intaglio printing master having said one of the bump female die portions and said groove portions is made of an elastic plastic material.

62. The method as claimed in claim 61, wherein said one of the bump female die portions and said groove portions of said intaglio printing master are formed by excimer laser working.

63. The method as claimed in claim 49, wherein said groove portions have cross-sections at right angles with respect to extending directions of said groove portions with such an aspect ratio of the depth thereof to the width thereof that the depth thereof is greater than and the width thereof is smaller than the respective depth and width of an aspect ratio of 1:5.

64. A method of forming one of bumps and a wiring pattern on a printed circuit board in a superimposed manner, using an intaglio printing master having one of bump female die portions and groove portions corresponding to said wiring pattern, each in a printing shape, depressed below the surface of said printing master, by an intaglio printing method comprising the steps of (a) bringing said intaglio printing master, with a paste and a fused metal being filled in said one of the bump female die portions and said groove portions, into close contact with a print receiving material, and (b) separating said intaglio printing master from said print receiving material to transfer said one of the paste and said fused metal to said print receiving material, wherein said intaglio printing method further comprises the steps of:

(1) immersing said intaglio printing master having said one of the bump female die portions and said groove portions, each in said printing shape, in said one of the paste and said fused metal to fill said one of the bump female die portions and said groove portions with said one of the paste and said fused metal, (2) bringing a shielding plate into close and sliding contact with the surface of said printing master to remove said one of the paste and said fused metal therefrom and to close the openings of said one of the bump female die portions and the openings of said groove portions in which said one of the paste and said fused metal is filled, with said shielding plate, (3) taking out said printing master to which said shielding plate is closely attached from said one of the paste and said fused metal, (4) separating said shielding plate from the surface of said printing master, (5) bringing said printing master free of said shielding plate into close contact with said print receiving material, and (6) separating said printing master from said print receiving material to transfer said one of the paste and said fused metal in said printing shapes to said print receiving material.

65. The method as claimed in claim 64, wherein in the step (1) of immersing said intaglio printing master having said one of the bump female die portions and said groove portions in said printing shapes in said one of the paste and said fused metal, pressure is applied thereto to fill said female die portions and said groove portions with said one of the paste and said fused metal.

66. The method as claimed in claim 65, further comprising the step of placing said intaglio printing master in one of a vacuum and an atmosphere of reduced pressure prior to the step of immersing said intaglio printing master having said one of the bump female die portions and said groove portions, each in said printing shape, in said one of the paste and said fused metal with the application of pressure thereto to fill said portions with said one of the paste and said fused metal.

67. The method as claimed in claim 66, wherein said atmosphere of reduced pressure is an atmosphere of an inert gas.

68. The method as claimed in claim 64, further comprising the step of placing said intaglio printing master in one of a vacuum and an atmosphere of reduced pressure prior to the step (1) of immersing said intaglio printing master having said one of the bump female die portions and said groove portions, each in said printing shape, in said one of the paste and said fused metal to fill said female die portions and said groove portions with said one of the paste and said fused metal.

69. The method as claimed in claim 68, wherein said atmosphere of reduced pressure is an atmosphere of an inert gas.

70. The method as claimed in claim 64, wherein the step (5) of bringing said printing master free of said shielding plate into close contact with said print receiving material, and the step (6) of separating said printing master from said print receiving material to transfer said one of the paste and said fused metal in said printing shape to said print receiving material, are carried out while said paste in said one of the bump female die portions and said groove portions is in an unsolidified state, or while said fused metal in said one of the bump female die portions and said groove portions is still in a fused state.

71. The method as claimed in claim 64, wherein the step (5) of bringing said printing master free of said shielding plate into close contact with said print receiving material is carried out while said paste in said one of the bump female die portions and said groove portions is in an unsolidified state, or while said fused metal in said one of the bump female die portions and said groove portions is still in a fused state, and the step (6) of separating said printing master from said print receiving material to transfer said one of the paste and said fused metal in said printing shapes to said print receiving material is carried out after said one of the paste and said fused metal in said one of the bump female die portions and said groove portions is in a solidified state.

72. The method as claimed in claim 64, wherein the step (5) of bringing said printing master free of said shielding plate into close contact with said print receiving material is carried out with said printing master being in pressure contact with said print receiving material.

73. The method as claimed in claim 64, wherein immediately after the step (3) of taking out said printing master to which said shielding plate is closely attached from said fused metal, said fused metal in said one of the bump female die portions and said groove portions is cooled below the melting point of said fused metal, and the step (4) of separating said shielding plate from the surface of said printing master is performed, and in the step (5) of bringing said printing master free of said shielding plate into close contact with said print receiving material, said cooled metal is heated to the melting point of said metal or above, and then cooled below the melting point of said metal, at that moment, said printing master is separated from said print receiving material to transfer said fused metal in said printing shape to said print receiving material.

74. The method as claimed in claim 64, wherein said intaglio printing master having said one of the bump female die portions and said groove portions is made of a plastic material.

75. The method as claimed in claim 74, wherein said one of the bump female die portions and said groove portions of said intaglio printing master are formed by excimer laser working.

76. The method as claimed in claim 64, wherein said intaglio printing master having said one of the bump female die portions and said groove portions is made of an elastic plastic material.

77. The method as claimed in claim 76, wherein said one of the bump female die portions and said groove portions of said intaglio printing master are formed by excimer laser working.

78. The method as claimed in claim 64, wherein said groove portions have cross-sections at right angles with respect to extending directions of said groove portions with such an aspect ratio of the depth thereof to the width thereof that the depth thereof is greater than and the width thereof is smaller than the respective depth and width of an aspect ratio of 1:5.

79. A method of forming a wiring pattern on one of a front side or a back side of a printed circuit board and a resist-coated substrate and forming one of a junction portion and a crossover portion of said wiring pattern, using an intaglio printing master having groove portions depressed below the surface of said printing master, in a printing shape corresponding to said wiring pattern, by an intaglio printing method comprising the steps of (a) bringing said intaglio printing master, with one of a paste and a fused metal being filled in said groove portions, into close contact with a print receiving material, and (b) separating said intaglio printing master from said print receiving material to transfer said one of the paste and said fused metal to said print receiving material, wherein said intaglio printing method further comprises the steps of:

(1) immersing said intaglio printing master having said groove portions in said printing shape in said one of the paste and said fused metal to fill said groove portions with said one of the paste and said fused metal, (2) bringing a shielding plate into close and sliding contact with the surface of said printing master to remove said one of the paste and said fused metal therefrom and to close the openings of said groove portions in which said one of the paste and said fused metal is filled, with said shielding plate, (3) taking out said printing master to which said shielding plate is closely attached from said one of the paste and said fused metal, (4) separating said shielding plate from the surface of said printing master, (5) bringing said printing master free of said shielding plate into close contact with said print receiving material, and (6) separating said printing master from said print receiving material to transfer said one of the paste and said fused metal in said printing shape to said print receiving material.

80. The method as claimed in claim 79, wherein in the step (1) of immersing said intaglio printing master having said groove portions in said printing shape in said one of the paste and said fused metal, pressure is applied thereto to fill said groove portions with said one of the paste and said fused metal.

81. The method as claimed in claim 80, further comprising the step of placing said intaglio printing master in one of a vacuum and an atmosphere of reduced pressure prior to the step of immersing said intaglio printing master having said groove portions in said printing shape in said one of the paste and said fused metal with the application of pressure thereto to fill said groove portions with said one of the paste and said fused metal.

82. The method as claimed in claim 81, wherein said atmosphere of reduced pressure is an atmosphere of an inert gas.

83. The method as claimed in claim 80, wherein the step (5) of bringing said printing master free of said shielding plate into close contact with said print receiving material is carried out while said paste in said groove portions is in an unsolidified state, or while said fused metal in said groove portions is still in a fused state, and the step (6) of separating said printing master from said print receiving material to transfer said one of the paste and said fused metal in said printing shape to said print receiving material is carried out after said one of the paste and said fused metal in said groove portions is in a solidified state.

84. The method as claimed in claim 79, further comprising the step of placing said intaglio printing master in one of a vacuum and an atmosphere of reduced pressure prior to the step (1) of immersing said intaglio printing master having said groove portions in said printing shape in said one of the paste and said fused metal to fill said groove portions with said one of the paste and said fused metal.

85. The method as claimed in claim 84, wherein said atmosphere of reduced pressure is an atmosphere of an inert gas.

86. The method as claimed in claim 79, wherein the step (5) of bringing said printing master free of said shielding plate into close contact with said print receiving material, and the step (6) of separating said printing master from said print receiving material to transfer said one of the paste and said fused metal in said printing shape to said print receiving material, are carried out while said paste in said groove portions is in an unsolidified state, or while said fused metal in said groove portions is still in a fused state.

87. The method as claimed in claim 79, wherein the step (5) of bringing said printing master free of said shielding plate into close contact with said print receiving material is carried out with said printing master being in pressure contact with said print receiving material.

88. The method as claimed in claim 79, wherein immediately after taking out said printing master to which said shielding plate is closely attached from said fused metal, said fused metal in said groove portions is cooled below the melting point of said fused metal, and the step (4) of separating said shielding plate from the surface of said printing master is performed, and in the step (5) of bringing said printing master free of said shielding plate into close contact with said print receiving material, said cooled metal is heated to the melting point of said metal or above, and then cooled below the melting point of said metal, at that moment, said printing master is separated from said print receiving material to transfer said fused metal in said printing shape to said print receiving material.

89. The method as claimed in claim 79, wherein said intaglio printing master having said groove portions is made of a plastic material.

90. The method as claimed in claim 89, wherein said groove portions of said intaglio printing master are formed by excimer laser working.

91. The method as claimed in claim 79, wherein said intaglio printing master having said groove portions is made of an elastic plastic material.

92. The method as claimed in claim 91, wherein said groove portions of said intaglio printing master are formed by excimer laser working.

93. The method as claimed in claim 79, wherein said groove portions have cross-sections at right angles with respect to extending directions of said groove portions with such an aspect ratio of the depth thereof to the width thereof that the depth thereof is greater than and the width thereof is smaller than the respective depth and width of an aspect ratio of 1:5.

94. An apparatus for forming one of bumps and a wiring pattern on a substrate, which is capable of (a) bringing an intaglio printing master having one of bump female die portions and groove portions corresponding to said wiring pattern, each in a printing shape, depressed below the surface of said printing master, in which said one of the bump female die portions and said groove portions have one of a paste and a fused metal filled therein, into close contact with a print receiving material, and (b) separating said intaglio printing master from said print receiving material to transfer said one of the paste and said fused metal in said printing shape to said print receiving material, comprising:

(1) an airtight housing for holding therein said one of the paste and said fused metal, provided with a vacant space therein, (2) means for changing pressure in said vacant space of said airtight housing, (3) a shielding plate which can be brought into close and sliding contact with the surface of said printing master which is immersed in said one of the paste and said fused metal to remove said one of the paste and said fused metal therefrom and to close the openings of said one of the bump female die portions and said groove portions in which said one of the paste and said fused metal is filled, with said shielding plate, (4) means for immersing said intaglio printing master in said one of the paste and said fused metal placed in said airtight housing, to fill said one of the bump female die portions and said groove portions with said one of the paste and said fused metal, (5) means for bringing said shielding plate into close and sliding contact with the surface of said printing master to remove said one of the paste and said fused metal therefrom and to close the openings of said one of the bump female die portions and said groove portions in which said one of the paste and said fused metal is filled, with said shielding plate, (6) means for taking out said printing master to which said shielding plate is closely attached from said one of the paste and said fused metal, (7) means for separating said shielding plate from the surface of said printing master, (8) means for bringing said printing master free of said shielding plate into close contact with said print receiving material, and (9) means for separating said printing master from said print receiving material to transfer said one of the paste and said fused metal in said printing shapes to said print receiving material.

* * * * *

UNITED STATES PATENT AND TRADEMARK OFFICE
CERTIFICATE OF CORRECTION

PATENT NO. : 6,109,175
DATED : AUGUST 29, 2000
INVENTOR(S): MAKOTO KINOSHITA

It is certified that an error appears in the above-identified patent and that said Letters Patent is hereby corrected as shown below:

Column 8, line 11, change "mater" to --master--; and line 26, change "mater" to --master--.

Column 9, line 12, change "solider" to --solder--.

Column 11, line 11, change "mater" to --master--.

Column 13, line 15, change "pyramide" to --pyramid--.

Column 14, line 12, change "solider" (both occurrences) to --solder--; and line 60, change "Sight" to --Slight--.

Column 15, line 16, change "patter" to --pattern--.

Column 16, line 3, change "lihgt" to --light--; and line 15, delete "not".

Column 17, line 1, change "cna" to --can--;

line 6, change "Such" to --such--;

line 24, delete "conta";

line 52, delete the comma; and line 61, change "change" to --changed--.

UNITED STATES PATENT AND TRADEMARK OFFICE
CERTIFICATE OF CORRECTION

PATENT NO. : 6,109,175

DATED : AUGUST 29, 2000

INVENTOR(S): MAKOTO KINOSHITA

It is certified that an error appears in the above-identified patent and that said Letters Patent is hereby corrected as shown below:

Column 18, line 3, change "So" to --so--.

Column 19, line 59, change "2" to --1--; and line 62, after "step" insert --(1)--.

Signed and Sealed this

First Day of May, 2001

Attest:

NICHOLAS P. GODICI

*Attesting Officer*     *Acting Director of the United States Patent and Trademark Office*